United States Patent
Lyons et al.

(10) Patent No.: US 8,308,982 B2
(45) Date of Patent: Nov. 13, 2012

(54) ALKALINE AND ALKALINE EARTH METAL PHOSPHATE HALIDES AND PHOSPHORS

(75) Inventors: Robert Joseph Lyons, Burnt Hills, NY (US); Anant Achyut Setlur, Niskayuna, NY (US); Robert John Cleaver, West Charlton, NY (US)

(73) Assignee: General Electric Company, Niskayuna, NY (US)

( * ) Notice: Subject to any disclaimer, the term of this patent is extended or adjusted under 35 U.S.C. 154(b) by 256 days.

(21) Appl. No.: 12/873,090

(22) Filed: Aug. 31, 2010

(65) Prior Publication Data

US 2012/0049116 A1 Mar. 1, 2012

(51) Int. Cl.
C09K 11/08 (2006.01)
C09K 11/70 (2006.01)
(52) U.S. Cl. ............... 252/301.4 P; 252/301.4 H
(58) Field of Classification Search ........... 252/301.4 P, 252/301.4 H, 301.4 F; 117/941; 423/315; 205/318, 489; 424/603
See application file for complete search history.

(56) References Cited

U.S. PATENT DOCUMENTS

| | | | |
|---|---|---|---|
| 7,497,973 B2 | 3/2009 | Radkov et al. | |
| 2007/0046176 A1 | 3/2007 | Bukesov et al. | |
| 2009/0267485 A1 | 10/2009 | Nagatomi et al. | |
| 2010/0142189 A1 | 6/2010 | Hong et al. | |

OTHER PUBLICATIONS

Nagpure et al., Combustion synthesis of Na2S4r(PO4)F:Dy3+ white light emitting phosphor', Feb. 19, 2009, Luminescence, 5 pages (www.interscience.wiley.com)DOI 10.1002/bio.1132.*

Elena V. Sokolova ,Yurii K. Kabalov,Giovanni Ferrarisi,Julius Schneider,Alexander P. Khomyakov,"Modular Approach in Solving the Crystal Structure of a Synthetic Dimorph of Nacaphiten,a 2CalPO4IFFR, OMP Owder-Diffractidoant A"; The Canadian Mineralogist vol. 37, pp. 83-90 (1999).

Alexander P. Knomyakov; "The Distribution of minerals in hyperagpaitic rocks in terms of symmetry: evolution of views on the number and symmetry of minerals"; Geology of Greenland Survey bulletin 190,73-82 (2001); 10 Pages; http://www.geus.dk/publications/bull-gl/nr190/nr190_p073-082.pdf.

I.M. Nagpure, V. B. Pawade and S. J. Dhoble; "Combustion synthesis of Na2Sr(PO4)F:Dy3+white light emitting phosphor"; LUMINESCNECE The Journal of Biological and Chemical luminescence; Received:Sep. 18, 2008, Revised:Jan. 7, 2009,Accepted:Feb. 19, 2009,Published online in Wiley Interscience: 2009; (www.interscience.wiley.com)DOI 10.1002/bio.1132; 5 pages.

* cited by examiner

Primary Examiner — Emily Le
Assistant Examiner — Lynne Edmondson
(74) Attorney, Agent, or Firm — Mary Louise Gioeni

(57) ABSTRACT

Compounds, phosphor materials and apparatus related to nacaphite family of materials are presented. Potassium and rubidium based nacaphite family compounds and phosphors designed by doping divalent rare earth elements in the sites of alkaline earth metals in the nacaphite material families are descried. An apparatus comprising the phosphors based on the nacaphite family materials are presented herein. The compounds presented is of formula $A_2B_{1-y}R_yPO_4X$ where the elements A, B, R, X and suffix y are defined such that A is potassium, rubidium, or a combination of potassium and rubidium and B is calcium, strontium, barium, or a combination of any of calcium, strontium and barium. X is fluorine, chlorine, or a combination of fluorine and chlorine, R is europium, samarium, ytterbium, or a combination of any of europium, samarium, and ytterbium, and y ranges from 0 to about 0.1.

20 Claims, 7 Drawing Sheets

ALKALINE AND ALKALINE EARTH METAL PHOSPHATE HALIDES AND PHOSPHORS

STATEMENT REGARDING FEDERALLY SPONSORED RESEARCH AND DEVELOPMENT

This invention was made with Government support under contract number DE-FC26-06NT42934 awarded by the U.S. Department of Energy. The Government has certain rights in the invention.

BACKGROUND

Light emitting diodes (LEDs) are semiconductor light emitters often used as a replacement for other light sources, such as incandescent lamps. They are particularly useful as display lights, warning lights and indicating lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN) and gallium indium nitride (GaInN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and host inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs are based on UV or blue emitting chips. The UV/blue emitting chips are coated with a phosphor that converts some of the blue radiation to a complementary color, e.g. a yellow-green emission. The total of the light from the phosphor and the LED chip provides a color point with corresponding color coordinates (x and y) and correlated color temperature (CCT), and its spectral distribution provides a color rendering capability, measured by the color rendering index (CRI).

One known white light emitting device comprises a blue light-emitting LED having a peak emission wavelength in the blue range (from about 440 nm to about 480 nm) combined with a phosphor, such as cerium doped yttrium aluminum garnet $Y_3Al_5O_{12}$: $Ce^{3+}$ ("YAG"). The phosphor absorbs a portion of the radiation emitted from the LED and converts the absorbed radiation to a yellow-green light. The remainder of the blue light emitted by the LED is transmitted through the phosphor and is mixed with the yellow light emitted by the phosphor. A viewer perceives the mixture of blue and yellow light as a white light.

Such systems can be used to make white light sources having correlated color temperatures (CCTs) of >4500 K and color rendering indices (CRIs) ranging from about 75-82. While this range is suitable for many applications, general illumination sources usually require higher CRIs and lower CCTs.

One method of achieving this is to use a GaInN violet emitting LED and three phosphors, one emitting blue, one emitting yellow or green and one emitting red. This method has the advantage that there are a greater number of phosphors available that can be efficiently excited by a violet LED in comparison with a blue LED. Thus, a need exists for red emitting phosphors that can be excited by radiation from a violet emitting LED.

BRIEF DESCRIPTION

Accordingly, in one aspect, the present invention relates to compounds of formula 1 as defined below.

$$A_2B_{1-y}R_yPO_4X \qquad (1)$$

The elements A, B, R, X and suffix y of compound $A_2B_{1-y}R_yPO_4X$ are defined such that A is potassium, rubidium, or a combination of potassium and rubidium and B is calcium, strontium, barium, or a combination of any of calcium, strontium and barium. X is fluorine, chlorine, or a combination of fluorine and chlorine, R is europium, samarium, ytterbium, or a combination of any of europium, samarium, and ytterbium, and y ranges from 0 to about 0.1.

In one aspect, the present invention relates to a compound of formula 1, where elements A, B, R, X and suffix y of compound of formula 1 are defined as below. A is sodium, potassium, rubidium, or a combination of these elements, B is calcium, or a combination of calcium and at least one of strontium and barium, X is fluorine, chlorine, or a combination of fluorine and chlorine, R is europium, samarium, ytterbium, or a combination of these elements, and y ranges from about 0.001 to about 0.1.

In another aspect, the present invention relates to one or more compounds selected from the group of $K_2CaPO_4F$, $K_2(Ca,Sr)PO_4F$, $K_2CaPO_4(F,Cl)$, $Rb_2CaPO_4F$, $Rb_2(Ca,Sr)PO_4F$, $Rb_2CaPO_4(F,Cl)$, $Rb_2Ca_{0.99}Eu_{0.01}PO_4F$, $K_2Ca_{0.99}Eu_{0.01}PO_4F$, $K_2Ca_{0.99}Eu_{0.01}PO_4Cl$, $K_2Ca_{0.99}Eu_{0.01}PO_4(F,Cl)$, $Na_2Ca_{0.99}Eu_{0.01}PO_4F$, $K_2(Ca,Sr)_{0.99}Eu_{0.01}PO_4F$, $Rb_2(Ca,Sr)_{0.99}Eu_{0.01}PO_4F$, $(Na,K)_2Ca_{0.99}Eu_{0.01}PO_4F$, and $(Na,K)_2(Ca,Sr)_{0.99}Eu_{0.01}PO_4F$.

In another aspect, the present invention relates to an LED lamp comprising a phosphor of formula 1, where elements A, B, R, X and suffix y of compound of formula 1 are defined as below. A is sodium, potassium, rubidium, or a combination of these elements, B is calcium, or a combination of calcium and at least one of strontium and barium, X is fluorine, chlorine, or a combination of fluorine and chlorine, R is europium, samarium, ytterbium, or a combination of these elements, and y ranges from about 0.001 to about 0.1.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
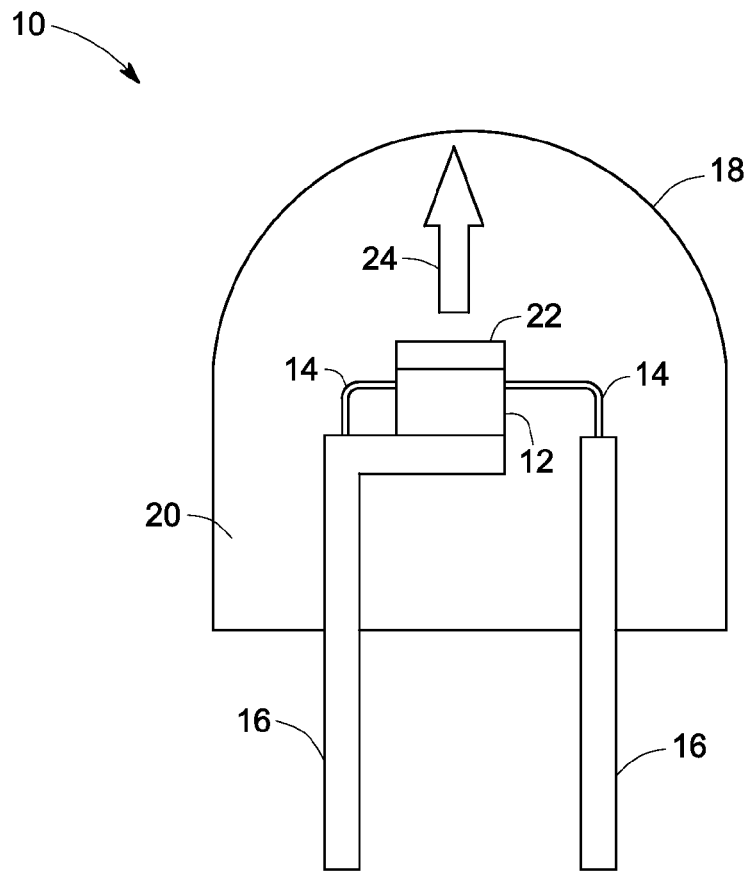
FIG. 1 is a schematic cross-sectional view of a lighting apparatus according to one embodiment of the present invention.

The compounds, phosphor materials and apparatus described herein include embodiments that relate to a nacaphite family of materials. Potassium and rubidium based nacaphite family compounds and phosphors designed by doping divalent rare earth elements in the sites of alkaline earth metals in the nacaphite material families are descried. An apparatus comprising the phosphors based on the nacaphite family materials are presented herein.

In the following specification and the claims that follow, the singular forms "a", "an" and "the" include plural referents unless the context clearly dictates otherwise.

In one embodiment of the present invention, a compound of nacaphite family with the formula $A_2B_{1-y}R_yPO_4X$ (denoted as formula 1) is presented. Nacaphite, a phosphate of the formula $Na_2CaPO_4F$ is a mineral with an inverse perovskite structure. Inverse perovskites are inorganic compounds with a perovskite structure but with cations replaced by anions and vice versa. The structure details and mineralogical property studies of $Na_2CaPO_4F$ exist in literature. However, the study of substitutes and dopants to the elements and their effects on the property of nacaphites are in the nascent stage.

In one embodiment, the compound with the formula $A_2B_{1-y}R_yPO_4X$ includes alkali metals such as potassium, rubidium, or a combination of potassium and rubidium in the A site. B can be an alkaline earth metal including calcium, strontium, barium, or a combination of any of calcium, strontium and barium. X is a halide from the group of fluorine, chlorine, and a combination of fluorine and chlorine. R is a dopant comprising rare earth elements such as europium, samarium, ytterbium, or a combination of any of europium, samarium, and ytterbium. Y denotes a dopant level in the nacaphite of the formula 1 and ranges from 0 to about 0.1. When y is 0, the compound is a phosphate fluoride or a phosphate chloride with any combination of the above mentioned A and B elements.

Some of the compounds of formula 1 without any rare earth doping include $K_2CaPO_4F$, $K_2(Ca,Sr)PO_4F$, $K_2CaPO_4(F,Cl)$, $Rb_2CaPO_4F$, $Rb_2(Ca,Sr)PO_4F$, and $Rb_2CaPO_4(F,Cl)$, $(K,Rb)_2CaPO_4F$, $(K,Rb)_2(Ca,Sr)PO_4F$, and $(K,Rb)_2CaPO_4(F,Cl)$.

When y is greater than zero, the compound is a rare earth doped phosphate fluoride or a phosphate chloride. These rare earth doped compounds may be functioning as phosphors by absorbing certain wavelengths of light and emitting in certain other wavelength region. In one embodiment, the rare earth doping of the formula 1 is less than about 10% based on molar weight of the compound.

In one embodiment, the phosphor compounds of formula 1 are such that the element A in the formula 1 can be substituted by sodium, potassium, rubidium and any combination of these materials. In one embodiment, B is either calcium, or a combination of calcium with other alkaline earth metal elements such as, for example, strontium and barium. X is fluorine, chlorine or a combination of fluorine and chlorine. R includes europium, samarium and/or ytterbium such that the dopant levels of R is in the range of about 0.001 to about 0.1 so that the dopant inclusion is in the range of about 0.1 molar percent to about 10 molar percent of the B site.

In one embodiment, the phosphors of formula 1 is with potassium or a combination of potassium in the A site. In another embodiment, the A site is filled by rubidium and combinations of rubidium. In yet another embodiment, the A site is occupied by sodium. A combination with any of potassium, rubidium and sodium may exist as element A in formula 1.

In one embodiment, the phosphors of formula 1 are with calcium or a combination of calcium in the B site. In one embodiment, R includes europium and/or a combination of europium, samarium, and ytterbium.

In one embodiment, the phosphor compounds of formula 1 are such that the dopant level y ranges between 0.005 and 0.05. In a further embodiment, y ranges from about 0.01 to about 0.03. In one embodiment, y is 0.01.

The phosphor compounds of formula 1 with one or more rare earth metal dopant includes $Rb_2Ca_{1-y}Eu_yPO_4F$, $K_2Ca_{1-y}Eu_yPO_4F$, $K_2Ca_{1-y}Eu_yPO_4Cl$, $K_2Ca_{1-y}Eu_y\ PO_4\ (F,Cl)$ $Na_2Ca_{1-y}Eu_yPO_4F$, $K_2(Ca,Sr)_{1-y}Eu_yPO_4F$, $K_2(Ca,Sr)_{1-y}Eu_yPO_4(F,Cl)$, $(Na,K)_2Ca_{1-y}Eu_yPO_4F$, and $(Na,K)_2(Ca,Sr)_{1-y}Eu_yPO_4F$.

Non limiting specific examples of phosphor compounds of formula 1 include $Rb_2Ca_{0.99}Eu_{0.01}PO_4F$, $K_2Ca_{0.99}Eu_{0.01}PO_4F$, $K_2Ca_{0.99}Eu_{0.01}PO_4Cl$, $K_2Ca_{0.99}Eu_{0.01}PO_4(F,Cl)$, $Na_2Ca_{0.99}Eu_{0.01}PO_4F$, $K_2(Ca,Sr)_{0.99}Eu_{0.01}PO_4F$, $Rb_2(Ca,Sr)_{0.99}Eu_{0.01}PO_4F$, $(Na,K)_2Ca_{0.99}Eu_{0.01}PO_4F$, and $(Na,K)_2(Ca,Sr)_{0.99}Eu_{0.01}PO_4F$.

Phosphors of formula 1 may be produced using known solid state reaction or solution processes for the production of phosphors by combining, for example, elemental oxides, carbonates, hydroxides, and/or halides as starting materials. Other starting materials may include nitrates, sulfates, acetates, citrates, or oxalates. Alternately, co precipitates of the rare earth oxides could be used as the starting materials for the RE elements.

The starting materials may be mixed together by any mechanical method including, but not limited to, stirring or blending in a high-speed blender or a ribbon blender. The starting materials may be combined and pulverized together in a bowl mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a suitable temperature for a time sufficient to convert all of the mixture to the final composition.

In a typical process, the starting materials are combined via a dry or wet blending process and fired in air or under a reducing atmosphere at required temperature for compound formation. A fluxing agent may be added to the mixture before or during the step of mixing. This fluxing agent may be $AlF_3$, $NH_4Cl$ or any other conventional fluxing agent, such as a fluoride of at least one metal selected from the group consisting of terbium, aluminum, gallium, and indium. A quantity of a fluxing agent of less than about 10 percent by weight of the total weight of the mixture is adequate for fluxing purposes.

The phosphor compounds of formula 1 have their excitation wavelength in the range from about 365 nm to about 405 nm. These phosphors emit in the orange/red region of the visible spectrum.

The phosphors of formula 1 may contain optically inert trace impurities including, for example, KCl, RbCl, and $Eu_2O_3$. The presence of such impurities in an amount up to 10% by weight of the phosphor composition will not significantly affect the quantum efficiency or color of the phosphor.

The phosphors of formula 1 may be blended with one or more additional phosphors for use in different applications. Thus, in one embodiment, an LED lighting apparatus is provided including a phosphor composition comprising a blend of any of the phosphor compound of formula 1 with one or more additional phosphors.

The relative amounts of each phosphor in a phosphor blend can be described in terms of spectral weight. Spectral weight is the relative amount that each phosphor contributes to the overall emission spectrum of the device. The spectral weight amounts of all the individual phosphors and any residual bleed from the LED source should add up to 1.0 (i.e. 100%). In one embodiment, the above-described phosphor has a spectral weight ranging from about 0.001 to 0.75. Any known blue, blue-green, green, yellow, orange or red phosphor suitable for use in UV or blue LED systems may be used in blends with this phosphor to customize the white color of the resulting light and produce higher CRI sources. While not intended to be limiting, suitable phosphors that can be used in the blend with the present phosphors of formula 1 include phosphors such as Blue/Blue-Green
$(Ba,Sr,Ca)_5(PO_4)_3(Cl,F,Br,OH):Eu^{2+},Mn^{2+}$ (SECA)
$(Ba,Sr, Ca)BPO_5:Eu^{2+},Mn^{2+}$
$(Sr,Ca)_{10}(PO_4)_6.B_2O_3:Eu^{2+}$ (wherein $0< \leq 1$)
$Sr_2Si_3O_8.2SrCl_2:Eu^{2+}$
$(Ca,Sr,Ba)_3MgSi_2O_8:Eu^{2+},Mn^{2+}$
$BaAl_8O_{13}:Eu^{2+}$
$2SrO.0.84P_2O_5.0.16B_2O_3:Eu^{2+}$
$(Sr,Ca,Ba)_4Al_{14}O_{25}:Eu^{2+}$ (SAE)
$(Ba,Sr, Ca)MgAl_{10}O_{17}:Eu^{2+},Mn^{2+}$
Green/Yellow-Green
$(Ba,Sr,Ca)Al_2O_4:Eu^{2+}$
$(Y,Gd,Lu,Sc,La)BO_3:Ce^{3+},Tb^{3+}$
$(Ba,Sr,Ca)_2Si_{1-}O_{4-2}:Eu^{2+}$ (wherein $0\leq \leq 0.2$) (SASI)
$(Ba,Sr,Ca)_2(Mg,Zn)Si_2O_7:Eu^{2+}$
$(Sr,Ca,Ba)(Al,Ga,In)_2S_4:Eu^{2+}$
$(Sr,Ca,Ba)_3Al_{1-x}Si_xO_{4+x}F_{1-x}:Ce^{3+}$ (SASOF)
$(Y,Gd,Tb,La,Sm,Pr,Lu)_3(Sc,Al,Ga)_{5-} O_{12-3/2}:Ce^{3+}$ (wherein $0\leq \leq 0.5$) (YAG)
$(Lu,Sc,Y,Tb)_{2-u-v}Ce_vCa_{1+u}Li_wMg_{2-w}P_w(Si,Ge)_{3-w}O_{12-u/2}$
where $-0.5 \leq u \leq 1$; $0 < v \leq 0.1$; and
$0 \leq w \leq 0.2$ (LuSi)
$(Ca,Ba,Sr)Si_2O_2N_2:Eu^{2+},Ce^{3+}$
$(Ca,Sr)_8(Mg,Zn)(SiO_4)_4Cl_2:Eu^{2+},Mn^{2+}$
$Na_2Gd_2B_2O_7:Ce^{3+},Tb^{3+}$
$(Sr,Ca,Ba,Mg,Zn)_2P_2O_7:Eu^{2+},Mn^{2+}$
Orange/Red
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$(Ca,Sr)S:Eu^{2+},Ce^{3+}$
$SrY_2S_4:Eu^{2+}$
$CaLa_2S_4:Ce^{3+}$
$(Ba,Sr,Ca)MgP_2O_7:Eu^{2+},Mn^{2+}$
$(Y,Lu)_2WO_6:Eu^{3+},Mo^{6+}$
$(Ba,Sr,Ca) SiN:Eu^{2+},Ce^{3+}$ (wherein 2+4=3)
$Ca_3(SiO_4)Cl_2:Eu^{2+}$
$(Y,Lu,Gd)_{2-} CaSi_4N_{6+} C_{1-}:Ce^{3+}$, (wherein $0\leq \leq 0.5$)
$(Lu,Ca,Li,Mg,Y)alpha-SiAlON:Eu^{2+},Ce^{3+}$
$3.5MgO.0.5MgF_2.GeO_2:Mn^{4+}$ (MFG)
$Ca_{1-c-f}Ce_cEu_fAl_{1+c}Si_{1-c}N_3$, (where $0<c\leq0.2$, $0\leq f\leq0.2$)
$Ca_{1-h-r}Ce_hEu_rAl_{1-h}(Mg,Zn)_hSiN_3$, (where $0<h\leq0.2$, $0\leq r\leq0.2$)
$Ca_{1-2s-t}Ce_s(Li,Na)_sEu_tAlSiN_3$, (where $0\leq s\leq0.2$, $0\leq f\leq0.2$, $s+t>0$)
$Ca_{1---\phi}Ce (Li,Na) EuAl_{1+-} Si_{1-+} N_3$, (where $0\leq \leq 0.2$, $0< \leq 0.4$, $0\leq \leq 0.2$) and complex fluorides doped with $Mn^{4+}$, such as $(Na,K,Rb,Cs,NH_4)_2(Ti,Ge,Sn,Si,Zr,Hf)F_6:Mn^{4+}$.

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. In many applications, a white light is preferably produced. This white light may, for instance, possess an x value in the range of about 0.30 to about 0.55, and a y value in the range of about 0.30 to about 0.55. As stated, however, the exact identity and amounts of each phosphor in the phosphor composition can be varied according to the needs of the end user. When combined with a LED emitting at from about 350 to about 550 nm and, optionally, one or more additional phosphors, the use of the phosphor compound described above allows for a white LED device having a higher CRI value and lower CCT as compared to a YAG based lighting device. LED devices having CCT values from about 2500 to about 10000, preferably from 2500 to 4500, and high CRI values from about 70 to 99 can be made.

For example, when using 405 nm LEDs the phosphor compounds described by formula 1 can be combined with a combination of phosphors that can include blue, blue-green, and red phosphors to make white light with CCT values ranging from 2500-10000 K and CRIs ranging from 70-99. One example of such a blend would be the phosphor compound described above in combination with the SECA blue phosphor, the SAE blue-green phosphor, and the MFG red phosphor.

The phosphor composition described above may be used in additional applications besides LEDs. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are meant to be merely exemplary and not exhaustive.

With reference to FIG. 1, a lighting apparatus or light emitting assembly or lamp 10 is shown in accordance with one embodiment of the present invention. Lighting apparatus 10 comprises a semiconductor long wave ultraviolet or violet radiation source, such as a light emitting diode (LED) chip 12 and leads 14 electrically attached to the LED chip. The leads 14 may comprise thin wires supported by a thicker lead frame(s) 16 or the leads may comprise self-supported electrodes and the lead frame may be omitted. The leads 14 provide current to the LED chip 12 and thus cause the LED chip 12 to emit radiation.

The lamp may include any semiconductor blue or UV light source that is capable of producing white light when its emitted radiation is directed onto the phosphor or phosphors. In one embodiment, the semiconductor light source comprises a blue emitting LED doped with various impurities. Thus, the LED may comprise a semiconductor diode based on any suitable III-V, II-VI or IV-IV semiconductor layers and having an emission wavelength of about 250 to about 550 nm. In particular, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $I+j+k=1$) having an emission wavelength greater than about 250 nm and less than about 550 nm. The chip may be a long wave ultraviolet, violet or blue emitting LED having a peak emission wavelength from about 350 to about 450 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by another radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. LED 12 may be substantially centered in the encapsulant 20. The encapsulant 20 may be an epoxy, plastic, low temperature glass, polymer, thermoplastic, thermoset material, resin or other type of LED encapsulating material as is known in the art. Optionally, the encapsulant 20 is a spin-on glass or some other high index of refraction material. Encapsulant material 20 is an epoxy or a polymer material, such as silicone, in particular embodiments. Both the shell 18 and the encapsulant 20 may be transparent or substantially optically transmissive with respect to the wavelength of light produced by the LED chip 12 and a phosphor composition 22 such as phosphor blend described in earlier paragraphs. Alternately, the lamp may 10 may only comprise an encapsulant material without an outer shell 18. The LED chip 12 may be supported, for example, by the lead frame 16, by the self-supporting electrodes, the bottom of the shell 18, or by a pedestal (not shown) mounted to the shell or to the lead frame. In some embodiments, the LED chip 12 is mounted in a reflective cup (not shown). The cup may be made from or coated with a reflective material, such as alumina, titania, or other dielectric powder known in the art. A preferred reflective material is $Al_2O_3$.

Lighting apparatus 10 includes phosphor composition 22, radiationally coupled to the LED chip 12. Radiationally coupled means that the elements are associated with each other so radiation from one is transmitted to the other. Phosphor composition 22 is deposited on the LED 12 by any appropriate method. For example, a water-based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor composition 22 and LED 12. Thus, the phosphor composition 22 may be coated over or directly on the light emitting surface of the LED chip 12 by coating and drying the phosphor suspension over the LED chip 12. Both the shell 18 and the encapsulant 20 should be transparent to allow white light 24 to be transmitted through those elements. Although not intended to be limiting, in one embodiment, the median particle size of the phosphor composition may be from about 1 to about 10 microns.

In other embodiments, the phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by the phosphor composition 22, and the mixed light appears as white light. If the phosphor is to be interspersed within the material of encapsulant 20, then a phosphor powder may be added to a polymer precursor, loaded around the LED chip 12, and then the polymer precursor may be cured to solidify the polymer material. Other known phosphor interspersion methods may also be used, such as transfer loading.

In yet another embodiment, phosphor composition 22 is coated onto a surface of the shell 18, instead of being formed over the LED chip 12. The phosphor composition may be coated on the inside surface of the shell 18, although the phosphor may be coated on the outside surface of the shell, if desired. The phosphor composition 22 may be coated on the entire surface of the shell or only a top portion of the surface of the shell. The long wave ultraviolet, violet or blue light emitted by the LED chip 12 mixes with the light emitted by the phosphor composition 22, and the mixed light appears as white light. Of course, the phosphor may be located in any two or all three locations or in any other suitable location, such as separately from the shell or integrated into the LED.

Lamp 10 may also include scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, with a negligible amount of absorption.

EXAMPLES

The following examples illustrate methods, materials and results, in accordance with specific embodiments, and as such should not be construed as imposing limitations upon the claims. All components are commercially available from common chemical suppliers.

Figure 2:
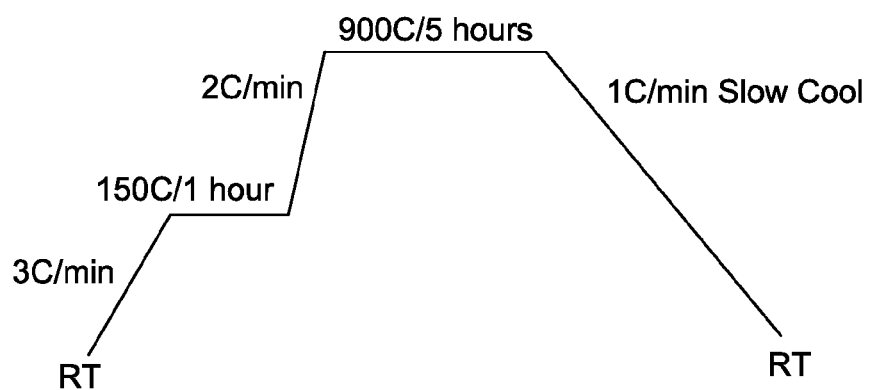
FIG. 2 is a schematic temperature profile of preparation of a phosphor compound according to one embodiment of the present invention.

5 gram (0.0214 mole) batch of $K_2Ca_{0.99}Eu_{0.01}PO_4F$ compound was prepared using about 1.2448 grams of potassium fluoride (KF), about 2.1229 grams of calcium carbonate ($CaCO_3$), about 0.0377 grams of europium oxide ($Eu_2O_3$), 2.8295 grams of diammonium phosphate (DAP), and about 1.4806 grams of potassium carbonate ($K_2CO_3$). All materials were dry milled for 2 hours using finely ground DAP as a precursor. Excess KF was used in various amounts as a flux or to compensate the evaporation. Materials were fired in an open alumina crucible inside a mullite tube furnace with the temperature profile shown in FIG. 2. About 1% hydrogen in nitrogen atmosphere was used for the heat treatment. During the heat treatment, a temperature hold at 150° C. and slow heating help to controllably decompose DAP. Slow cooling may improve crystallization. After the heat treatment, the contents of the alumina crucible were removed, ground to make fine powders, washed with water and dried. Similar compounds were prepared by varying temperature of sintering and time durations of heating, hold and cooling. A 1000° C. sintering of the sample resulted in producing a melt of the sample.

Figure 3:
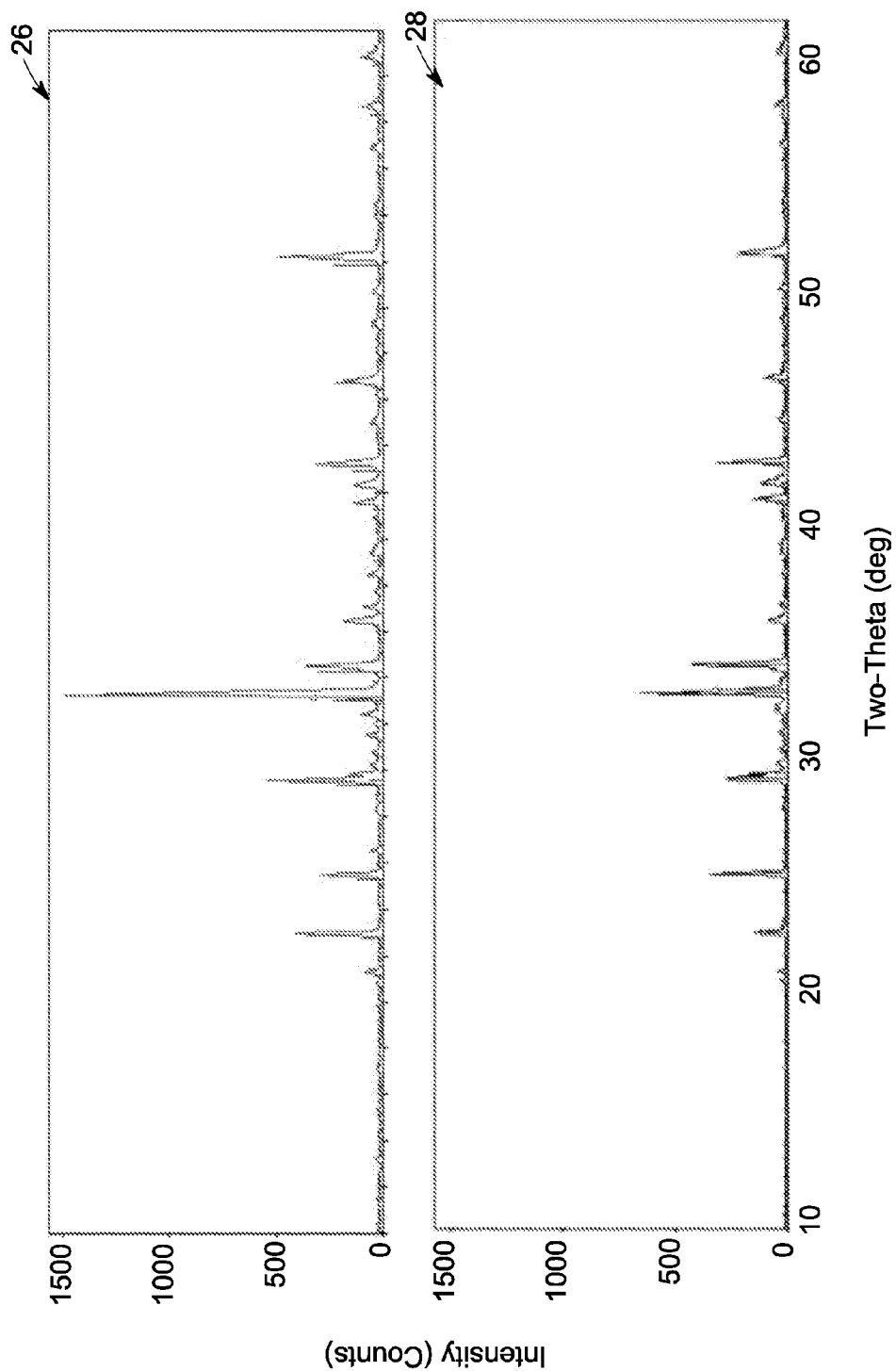
FIG. 3 is an XRD spectra comparison of an example phosphor compound with a standard, according to one embodiment of the present invention.

Powder XRD and elemental analysis using SEM were conducted to identify the resultant sample. FIG. 3 shows the XRD 26 of a resultant sample. The crystal structure of the sample compares with the crystal structure 28 of ICDD: 01-071-5491 corresponding to $Na_2CaPO_4F$ and the elemental analysis shows an expected weight percent of the constituents for $K_2CaPO_4F$ within an error of about 20%.

Figure 4:
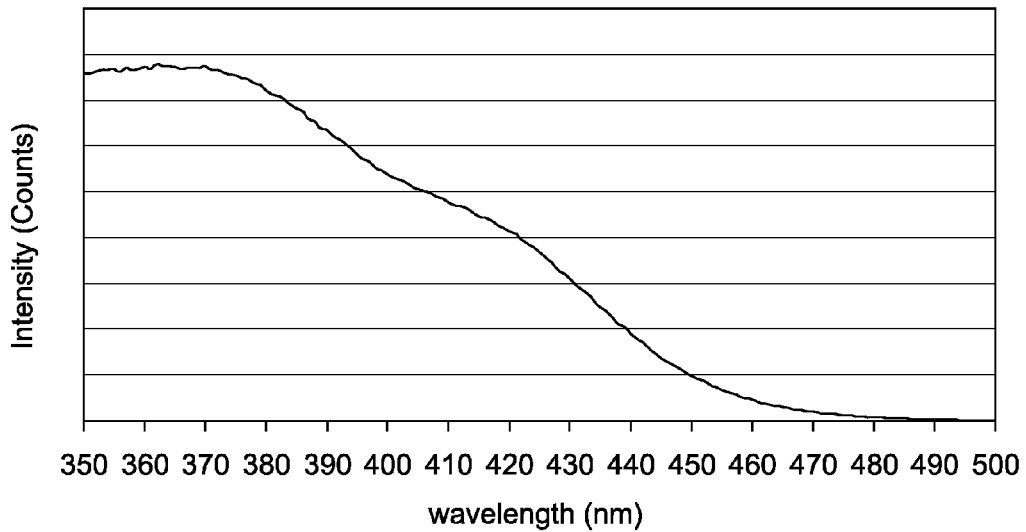
FIG. 4 is absorption spectra of an example phosphor compound according to one embodiment of the present invention.
Figure 5:
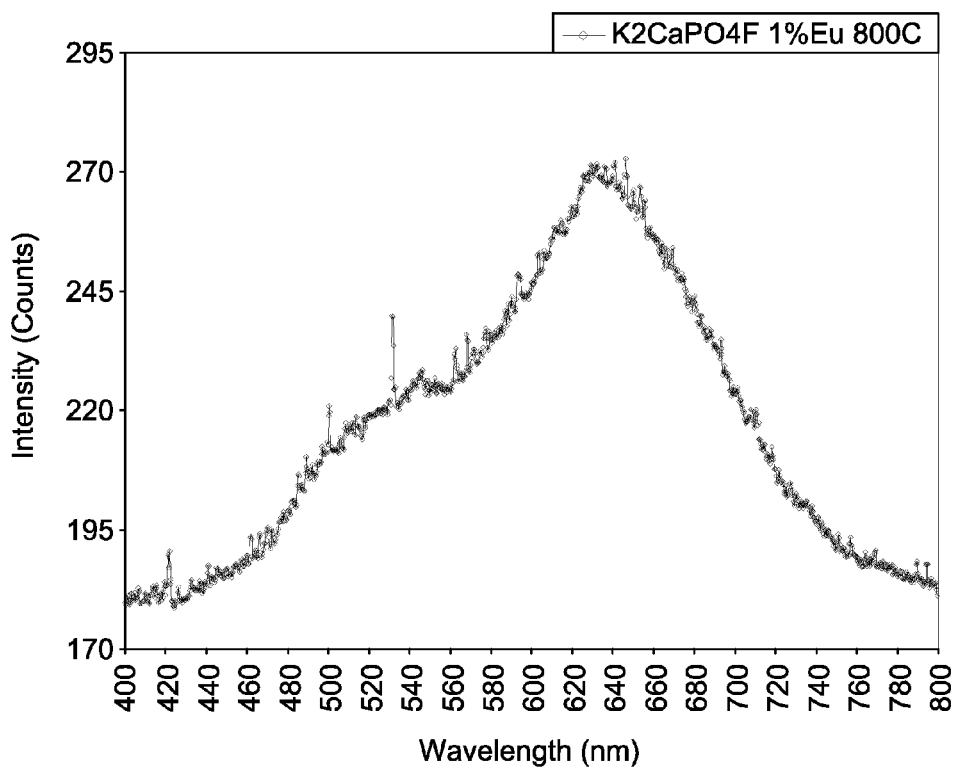
FIG. 5 is emission spectra of an example phosphor compound according to one embodiment of the present invention.

FIG. 4 and FIG. 5 show the excitation and emission spectra of the prepared sample. The quantum efficiency (QE) and absorbance (Abs) were determined using phosphor powders pressed into plaques. The QE measured was a relative measurement versus a standard LED phosphor $Sr_{1.64}Ca_{0.3}Eu_{0.06}Si_{0.96}O_{3.92}$ (SASI) set at 100%. The absorbance was calculated from reflectance measurements calibrated with pressed powder plaque of $BaSO_4$ as customary in the art. The relative QE/Abs of the sample under 405 nm excitation was about 62%/74%. The relative QE/Abs of a sample prepared with 5 mole % excess potassium fluoride under 405 nm excitation was about 72%/71%.

Figure 6:
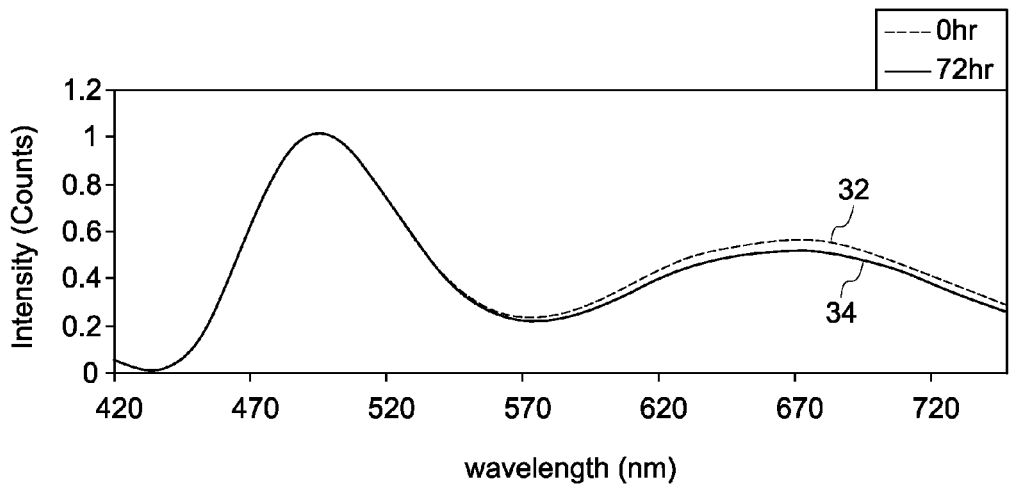
FIG. 6 is an emission spectra depicting stability of an example phosphor compound according to one embodiment of the present invention.

The sample prepared as mentioned above was blended in a ratio of 20 wt % $K_2Ca_{0.99}Eu_{0.01}PO_4F$ to 80% wt. % of SAE (Phillip's $Sr_4Al_{14}O_{25}:Eu^{2+}$) and initial emission at 405 nm excitation was obtained for the fresh sample 32 and the sample after 72 hours of exposure to 405 nm light from an LED designated sample 34, as shown in FIG. 6. It can be seen that about 8% degradation has happened to the sample after 72 hours when compared to the fresh sample. Synthesis and process modification may improve plaque reliability, which can be confirmed through additional tests.

Figure 7:
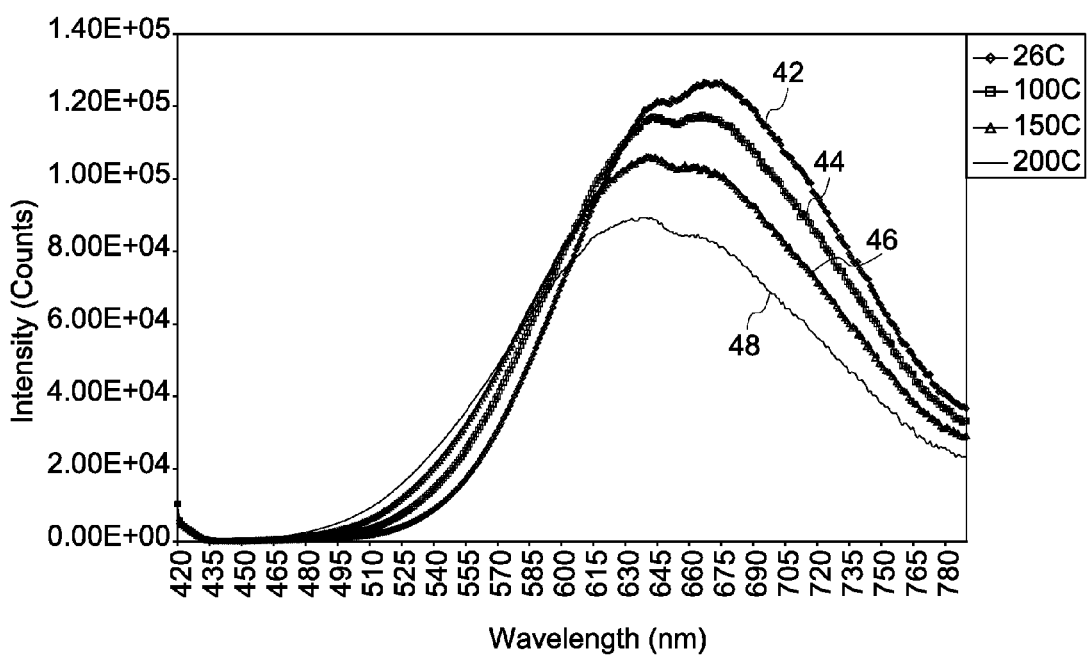
FIG. 7 is an emission spectra depicting thermal degradation of an example phosphor compound according to one embodiment of the present invention.

FIG. 7 provides the thermal stability graph of the above-described sample. The curves 42, 44, 46, and 48 related to emission spectra of the samples at 26° C., 100° C., 150° C., and 200° C., respectively. It can be observed from the graph that the intensity decrease is about 9.4% for the sample when the temperature is as high as 150° C.

Figure 8:
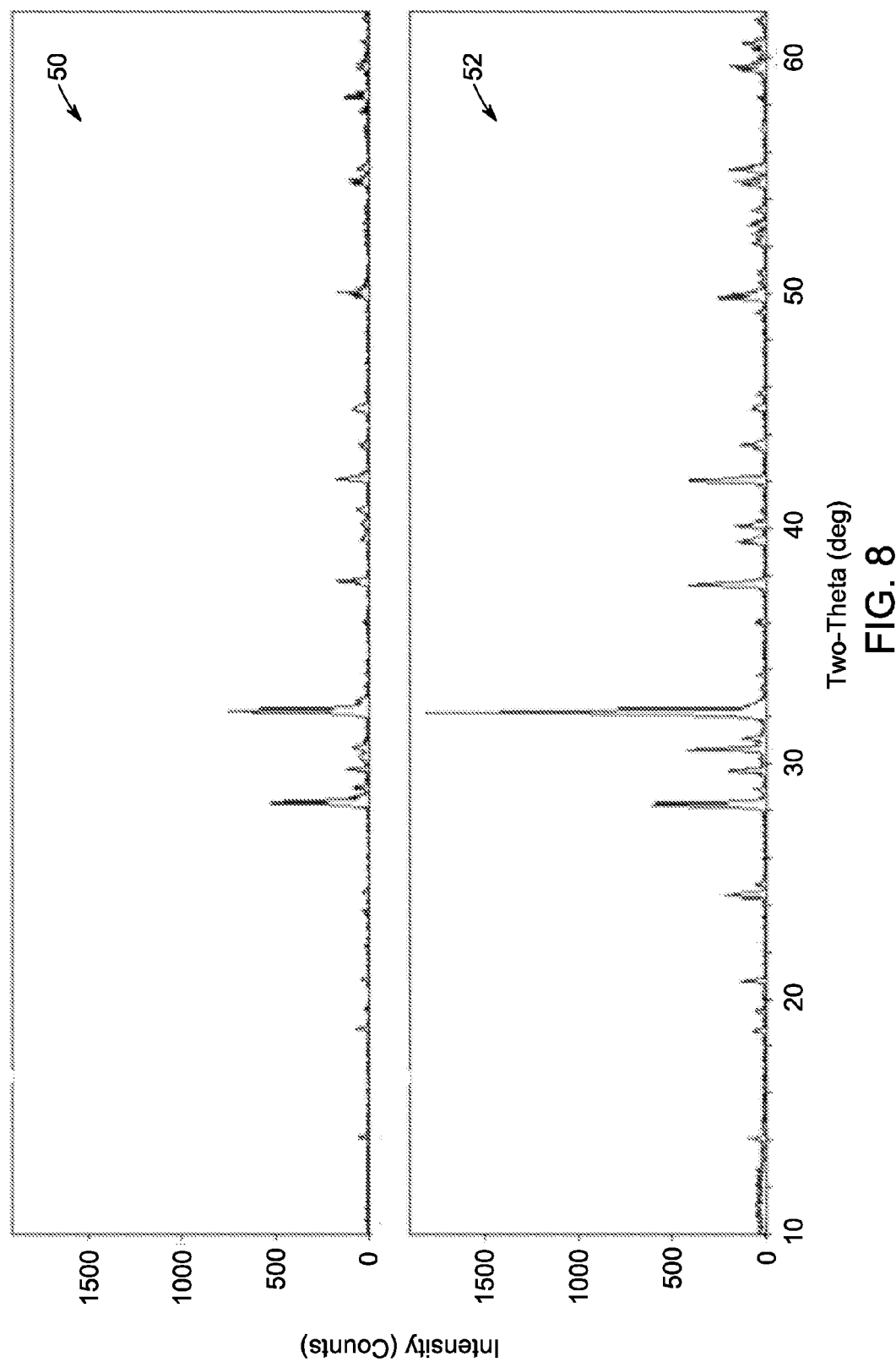
FIG. 8 is an XRD spectra comparison of an example phosphor compound with another compound, according to one embodiment of the present invention.
Figure 9:
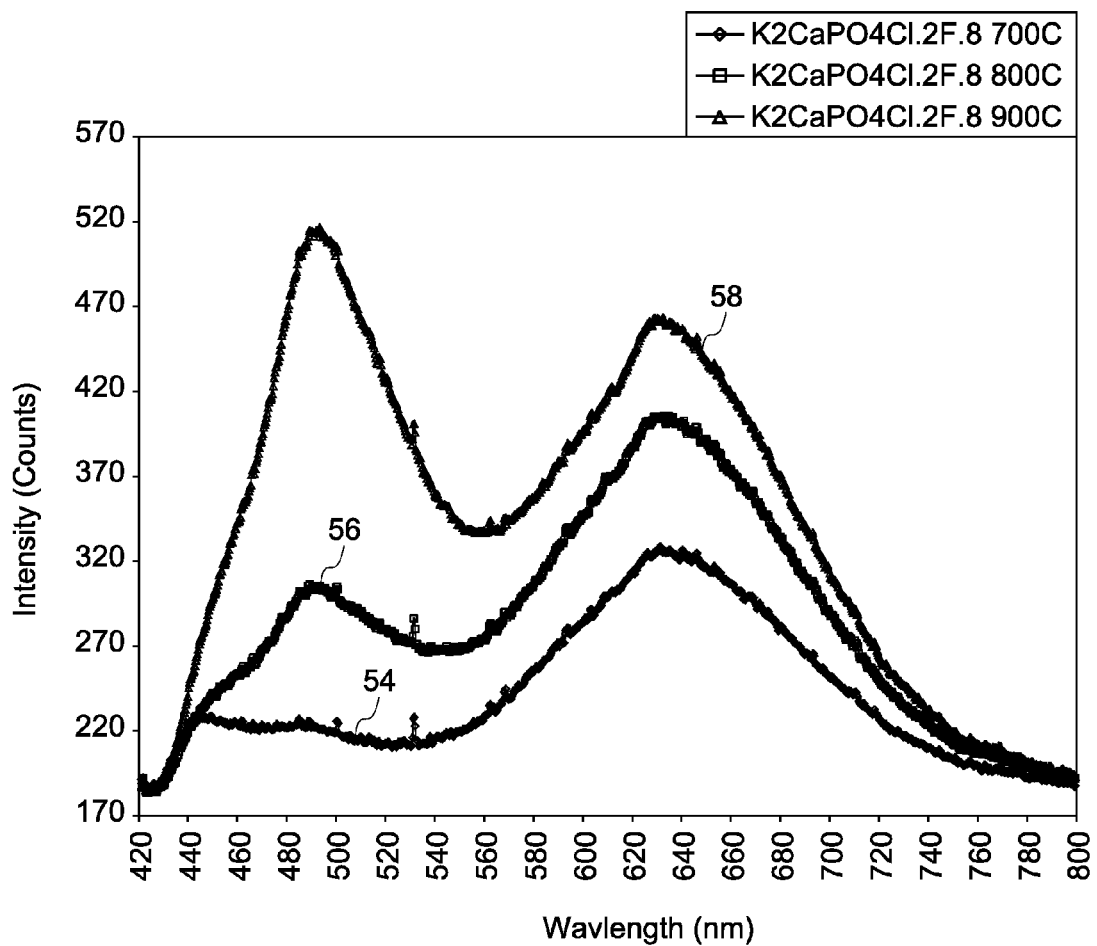
FIG. 9 is an emission spectra of an example phosphor compound treated at different temperatures, according to one embodiment of the present invention.
Figure 10:
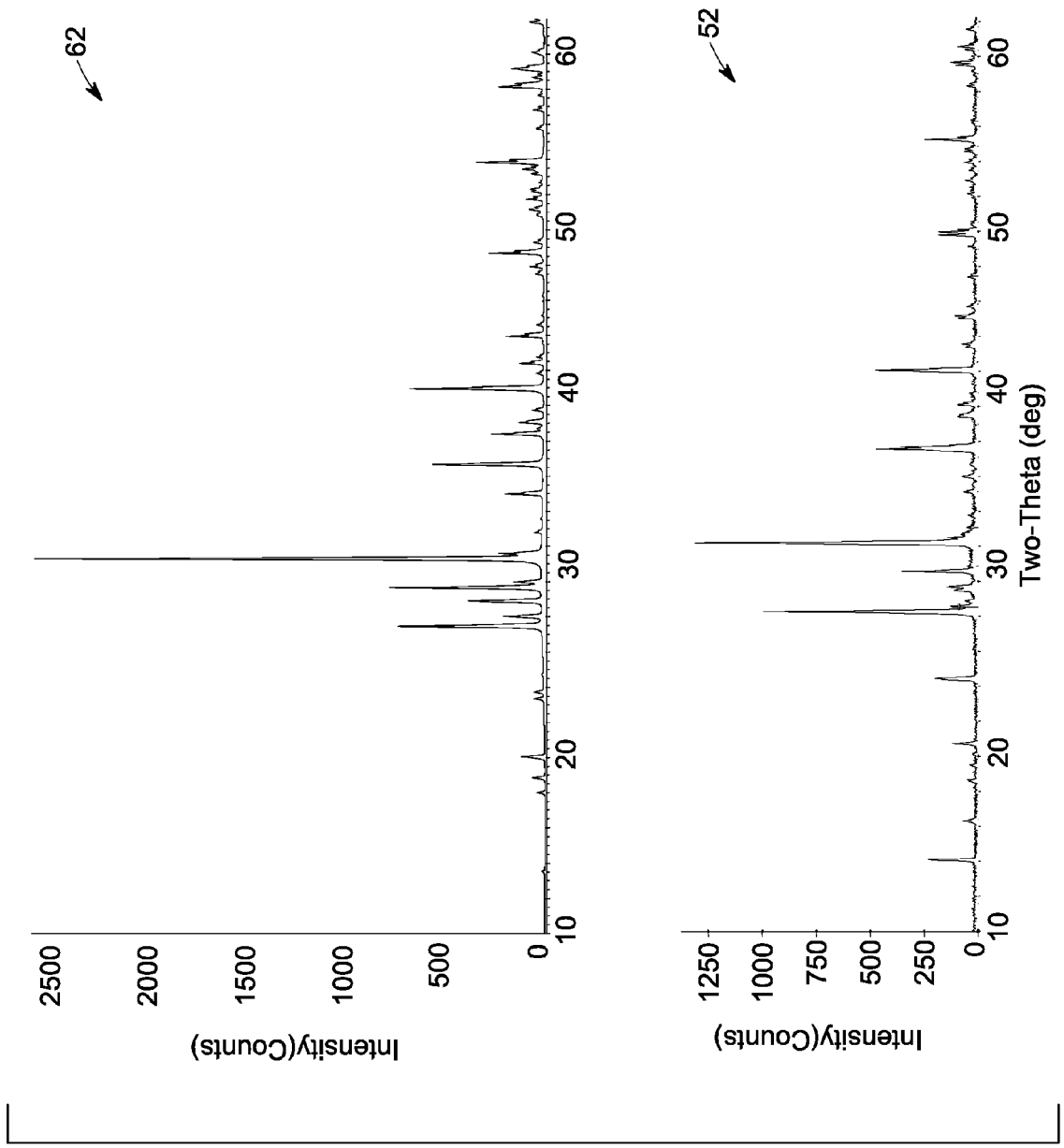
FIG. 10 is an XRD spectra comparison of an example phosphor compound with another compound, according to one embodiment of the present invention.

Phosphor samples with intended composition of $K_2Ca_{0.99}Eu_{0.01}PO_4Cl$, $K_2Ca_{0.99}Eu_{0.01}PO_4Cl_{0.2}F_{0.8}$, $NaKCa_{0.99}Eu_{0.01}PO_4F$, $Na_2Ca_{0.99}Eu_{0.01}PO_4F$, and $Rb_2Ca_{0.99}Eu_{0.01}PO_4F$ were prepared, sintered at 700° C., 800° C., and 900° C. and studied for their phase purity, quantum efficiency and stability. Sample $K_2Ca_{0.99}Eu_{0.01}PO_4Cl$ sintered at 800° C. and 900° C. had green luminescence. $Na_2Ca_{0.99}Eu_{0.01}PO_4F$ was found to have Blue/green emission for the sample sintered at 700° C. and a green emission for the sample sintered at 800° C. The sample sintered at 900° C. was melted. FIG. 8 provides the comparison of $K_2Ca_{0.99}Eu_{0.01}PO_4Cl_{0.2}F_{0.8}$ powder XRD 50 with that of $K_2Ca_{0.99}Eu_{0.01}PO_4F$ 52. While similarities in the peak positions can be noted for the two samples, some extra peaks can be noted in the XRD pattern 50 of the sample $K_2Ca_{0.99}Eu_{0.01}PO_4Cl_{0.2}F_{0.8}$ indicating that the sample may not be formed in a single phase. FIG. 9 shows the emission spectra 54, 56, and 58 of the $K_2Ca_{0.99}Eu_{0.01}PO_4Cl_{0.2}F_{0.8}$ samples prepared by sintering at 700° C., 800° C., and 900° C., respectively. It can be seen from the graph that the emission spectra has two maximums and intensity of emission increases as sintering temperature of the sample increases. FIG. 10 provides the comparison of $Rb_2Ca_{0.99}Eu_{0.01}PO_4$ powder XRD 62 with powder XRD 52 of $K_2Ca_{0.99}Eu_{0.01}PO_4F$. It can be seen that $Rb_2Ca_{0.99}Eu_{0.01}PO_4$ has same crystal structure as that of $K_2Ca_{0.99}Eu_{0.01}PO_4F$ but the peak positions of $Rb_2Ca_{0.99}Eu_{0.01}PO_4F$ has shifted to lower angles, may be due to the larger size of the rubidium atoms compared to potassium atoms.

Attempted compositional modifications with the rubidium substitution for potassium and strontium and barium substitution for calcium and the result of the sample preparation along with their observed emission characteristics are shown in the table 1 below. While these samples did not show exemplary emission or stability characteristics, there is a possibility of synthesis, process, and substitution modifications increasing the favorable characteristics of these samples.

TABLE 1

| Sample | Temperature | | |
|---|---|---|---|
| | 700° C. | 800° C. | 900° C. |
| $Rb_2Sr_{0.99}Eu_{0.01}PO_4F$ | blue/violet | sintered blue/violet | melted |
| $Li_2Ca_{0.99}Eu_{0.01}PO_4F$ | sintered, weak violet | melted | melted |
| $Li_2Ba_{0.99}Eu_{0.01}PO_4F$ | sintered, non luminescent | melted | melted |
| $Li_2Sr_{0.99}Eu_{0.01}PO_4F$ | sintered weak blue | melted | melted |
| $K_2Sr_{0.99}Eu_{0.01}PO_4F$ | blue/Violet, hygroscopic | sintered blue/violet, hygroscopic | sintered, bright blue |
| $K_2Ba_{0.99}Eu_{0.01}PO_4F$ | blue/violet, hygroscopic | Sintered blue | sintered, blue |
| $Na_2Ca_{0.99}Eu_{0.01}PO_4F$ | weak green/white | Weak violet | non luminescent |
| $Na_2Ba_{0.99}Eu_{0.01}PO_4F$ | non luminescent | non luminescent | non luminescent |

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A compound of formula $A_2B_{1-y}R_yPO_4X$, wherein
   A is potassium, rubidium, or a combination thereof;
   B is calcium, strontium, barium, or a combination thereof;
   X is fluorine, chlorine, or a combination thereof;
   R is europium, samarium, ytterbium, or a combination thereof; and
   y ranges from 0 to about 0.1.

2. The compound of claim 1, wherein B is calcium or a combination of calcium and strontium.

3. The compound of claim 1, wherein X is fluorine or a combination of fluorine and chlorine.

4. The compound of claim 1, selected from the group consisting of $K_2CaPO_4F$, $K_2(Ca,Sr)PO_4F$, $K_2CaPO_4(F,Cl)$, $Rb_2CaPO_4F$, $Rb_2(Ca,Sr)PO_4F$, $Rb_2CaPO_4(F,Cl)$, $Rb_2Ca_{1-y}Eu_yPO_4F$, $K_2Ca_{1-y}Eu_yPO_4F$, $K_2Ca_{1-y}Eu_yPO_4Cl$, and $K_2Ca_{1-y}Eu_yPO_4(F,Cl)$, wherein y ranges from about 0.005 to about 0.05.

5. The compound of claim 1, of formula $K_2CaPO_4F$.

6. The compound of claim 1, of formula $Rb_2CaPO_4F$.

7. A compound of formula $A2B1-yRyPO4X$, wherein
A is sodium, potassium, rubidium, or a combination thereof;
B is calcium, or a combination of calcium and at least one of strontium and barium;
X is fluorine, chlorine, or a combination thereof;
R is europium, samarium, ytterbium, or a combination thereof, and
y ranges from about 0.001 to about 0.1.

8. The compound of claim 7, wherein A comprises sodium.

9. The compound of claim 7, wherein B is calcium.

10. The compound of claim 7, wherein X is fluorine.

11. The compound of claim 7, wherein R is europium.

12. The compound of claim 7, selected from the group consisting of $Na_2Ca_{1-y}Eu_yPO_4F$, $K_2(Ca,Sr)_{1-y}Eu_yPO_4F$, $K_2(Ca,Sr)_{1-y}Eu_yPO_4(F,Cl)$, $(Na,K)_2Ca_{1-y}Eu_yPO_4F$, and $(Na,K)_2(Ca,Sr)_{1-y}Eu_yPO_4F$.

13. The compound of claim 7, wherein y ranges from about 0.005 to about 0.05.

14. The compound of claim 13, wherein y ranges from about 0.01 to about 0.03.

15. A compound selected from the group consisting of $K_2CaPO_4F$, $K_2(Ca,Sr)PO_4F$, $K_2CaPO_4(F,Cl)$, $Rb_2CaPO_4F$, $Rb_2(Ca,Sr)PO_4F$, $Rb_2CaPO_4(F,Cl)$, $Rb_2Ca_{0.99}Eu_{0.01}PO_4F$, $K_2Ca_{0.99}Eu_{0.01}PO_4F$, $K_2Ca_{0.99}Eu_{0.01}PO_4Cl$, $K_2Ca_{0.99}Eu_{0.01}PO_4(F,Cl)$, $Na_2Ca_{0.99}Eu_{0.01}PO_4F$, $K_2(Ca,Sr)_{0.99}Eu_{0.01}PO_4F$, $Rb_2(Ca,Sr)_{0.99}Eu_{0.01}PO_4F$, $(Na,K)_2Ca_{0.99}Eu_{0.01}PO_4F$, and $(Na,K)_2(Ca,Sr)_{0.99}Eu_{0.01}PO_4F$.

16. An LED lamp comprising a phosphor of formula $A2B1-yRyPO4X$, wherein
A is sodium, potassium, rubidium, or a combination thereof;
B is calcium, or a combination of calcium with at least one of strontium and barium;
X is fluorine, chlorine, or a combination thereof;
R is europium, samarium, ytterbium, or a combination thereof, and
y ranges from about 0.001 to about 0.1.

17. The LED lamp of claim 16, wherein A comprises potassium.

18. The LED lamp of claim 16, wherein B is calcium.

19. The LED lamp of claim 16, wherein X is fluorine.

20. The LED lamp of claim 16, wherein R is europium.

* * * * *